United States Patent
Woo et al.

(10) Patent No.: US 11,302,372 B2
(45) Date of Patent: Apr. 12, 2022

(54) MTJ STACK CONTAINING A TOP MAGNETIC PINNED LAYER HAVING STRONG PERPENDICULAR MAGNETIC ANISOTROPY

(71) Applicant: International Business Machines Corporation, Armonk, NY (US)

(72) Inventors: Seonghoon Woo, New York, NY (US); Matthias Georg Gottwald, New Rochelle, NY (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 16/785,238

(22) Filed: Feb. 7, 2020

(65) Prior Publication Data

US 2021/0249060 A1    Aug. 12, 2021

(51) Int. Cl.
| | |
|---|---|
| H01L 43/02 | (2006.01) |
| G11C 11/16 | (2006.01) |
| H01L 43/12 | (2006.01) |
| H01L 43/08 | (2006.01) |
| H01L 27/22 | (2006.01) |
| H01L 43/10 | (2006.01) |

(52) U.S. Cl.
CPC .......... *G11C 11/161* (2013.01); *H01L 27/222* (2013.01); *H01L 43/02* (2013.01); *H01L 43/08* (2013.01); *H01L 43/10* (2013.01); *H01L 43/12* (2013.01)

(58) Field of Classification Search
CPC ....... H01L 27/222; H01L 43/02; H01L 43/08; H01L 43/10; H01L 43/12; G11C 11/161

USPC ........................................................ 257/421
See application file for complete search history.

(56) References Cited

U.S. PATENT DOCUMENTS

| | | | |
|---|---|---|---|
| 8,278,123 B2 | 10/2012 | Choi et al. | |
| 9,341,685 B2 | 5/2016 | Nishioka et al. | |
| 9,424,904 B2* | 8/2016 | Lee | G11C 11/161 |
| 9,590,010 B1 | 3/2017 | Gottwald et al. | |
| 11,133,458 B2* | 9/2021 | Park | H01L 43/10 |
| 2006/0012926 A1* | 1/2006 | Parkin | H01L 43/08 |
| | | | 360/324.2 |

(Continued)

OTHER PUBLICATIONS

International Search Report dated Apr. 16, 2021, received in a corresponding foreign application, 8 pages.

(Continued)

*Primary Examiner* — Jami Valentine Miller
(74) *Attorney, Agent, or Firm* — Scully, Scott, Murphy & Presser, P.C.; Daniel P. Morris, Esq.

(57) ABSTRACT

A top pinned magnetic tunnel junction (MTJ) stack containing a magnetic pinned layered structure including a second magnetic pinned layer having strong perpendicular magnetic anisotropy (PMA) is provided. In the present application, the magnetic pinned layered structure includes a crystal grain growth controlling layer located between a first magnetic pinned layer having a body centered cubic (BCC) texture and the second magnetic pinned layer. The presence of the crystal grain growth controlling layer facilitates formation of a second magnetic pinned layer having a face centered cubic (FCC) texture or a hexagonal closed packing (HCP) texture which, in turn, promotes strong PMA to the second magnetic pinned layer of the magnetic pinned layered structure.

14 Claims, 5 Drawing Sheets

(56) References Cited

U.S. PATENT DOCUMENTS

| | | | |
|---|---|---|---|
| 2015/0041933 A1* | 2/2015 | Chepulskyy | H01F 10/30 |
| | | | 257/421 |
| 2015/0162525 A1 | 6/2015 | Park et al. | |
| 2015/0340600 A1* | 11/2015 | Kim | H01L 27/228 |
| | | | 257/421 |
| 2016/0254444 A1 | 9/2016 | Tahmasebi et al. | |
| 2017/0186943 A1 | 6/2017 | Annunziata et al. | |
| 2019/0066747 A1 | 2/2019 | Lee et al. | |
| 2019/0304521 A1 | 10/2019 | Tahmasebi et al. | |
| 2019/0305042 A1 | 10/2019 | Chen et al. | |
| 2020/0313084 A1* | 10/2020 | Ouellette | H01L 43/12 |

OTHER PUBLICATIONS

Mukherjee, S. S., et al., "Crystallization and grain growth behavior of CoFeB and MgO layers in multilayer magnetic tunnel junctions", Journal of Applied Physics, published online Aug. 5, 2009, pp. 033906-1 to 033906-7, 106.

Chen, P. J., et al., "Annealing Stability Study of Co20Fe60B20\MgO\Co20Fe60B20 Perpendicular Magnetic Tunnel Junctions", J. Phys. D. Appl. Phys. Jan. 18, 2017, 21 pages, 50(2).

* cited by examiner

MTJ STACK CONTAINING A TOP MAGNETIC PINNED LAYER HAVING STRONG PERPENDICULAR MAGNETIC ANISOTROPY

BACKGROUND

The present application relates to magnetoresistive random access memory (MRAM). More particularly, the present application relates to a top pinned magnetic tunnel junction (MTJ) stack containing a magnetic pinned layered structure including a second magnetic pinned layer having strong perpendicular magnetic anisotropy (PMA).

Spin-transfer torque (STT) MRAM devices use a 2-terminal device which includes a MTJ stack that contains a magnetic pinned (reference) layer, a tunnel barrier layer and a magnetic free layer. MTJ stacks can be classified into two types. The first type of MTJ stack is a bottom pinned MTJ stack such as is shown, for example, in FIG. 1. The bottom pinned MTJ stack illustrated in FIG. 1 includes a magnetic pinned (or reference) layer 10, a tunnel barrier layer 12, and a magnetic free layer 14. A MTJ capping layer 16 is typically present on the magnetic free layer 14 of the bottom pinned MTJ stack shown in FIG. 1. In FIG. 1, the arrow within the magnetic pinned layer 10 shows a possible orientation of that layer and the double headed arrow in the magnetic free layer 14 illustrates that the orientation in that layer can be switched.

The second type of MTJ stack is a top pinned MTJ stack such as is shown, for example, in FIG. 2. The top pinned MTJ stack includes a magnetic free layer 20, a tunnel barrier layer 22, and a magnetic pinned (or reference) layer 24. A MTJ capping layer 26 is typically present on the magnetic pinned layer 24 of the top pinned MTJ stack shown in FIG. 2. In FIG. 2, the arrow within the magnetic pinned layer 24 shows a possible orientation of that layer and the double headed arrow in the magnetic free layer 20 illustrates that the orientation in that layer can be switched.

In STT MRAM, a select transistor is needed for the MTJ stacks because currents of two different directions conduct the write operation of the MTJ stacks. In a typical STT MRAM, the threshold voltage switching current for an antiparallel configuration, $I_c$ (P (parallel state)→AP (antiparallel state)) is larger than that for a parallel configuration, $I_c$ (AP→P). However, the driving power of a transistor also has asymmetry that is not compatible with the writing current asymmetry of a conventional bottom pinned MTJ (BP-MTJ) stack in which pinned synthetic-antiferromagnetic (SAF) reference layers are deposited below a tunnel barrier layer for improved material texturizations from a metal seed layer.

STT MRAM devices with top pinned MTJ (TP-MTJ) stacks solve this asymmetry problem and therefore increase the power efficiency of STT MRAM devices. However, it is a challenge to fabricate stable TP-MTJ stacks compatible with high-temperature annealing cycles (400° C. back-end-of-the-line (BEOL) processes required for embedded-type memory applications). The reason is related to uncontrollable texturization on top of the tunnel barrier layer after high temperature processing, which makes it difficult to fabricate 400° C.-compatible top SAF reference layers.

SUMMARY

A top pinned magnetic tunnel junction (MTJ) stack containing a magnetic pinned layered structure including a second magnetic pinned layer having strong perpendicular magnetic anisotropy (PMA) is provided. In the present application, the magnetic pinned layered structure includes a crystal grain growth controlling layer located between a first magnetic pinned layer having a body centered cubic (BCC) texture and the second magnetic pinned layer. The presence of the crystal grain growth controlling layer facilitates formation of a second magnetic pinned layer having a face centered cubic (FCC) texture or a hexagonal closed packing (HCP) texture which, in turn, promotes strong PMA to the second magnetic pinned layer of the magnetic pinned layered structure. By "strong PMA" is it meant that the in-field magnetic anisotropy field is greater than 4 kOe.

In one aspect of the present application, a top pinned MTJ stack is provided. In one embodiment, the top pinned MTJ stack includes a magnetic free layer having a body centered cubic (BCC) texture, a tunnel barrier layer having a BCC texture located on the magnetic free layer, and a magnetic pinned layered structure located on the tunnel barrier layer. In accordance with the present application, the magnetic pinned layered structure includes, from bottom to top, a first magnetic pinned layer having a BCC texture, a crystal grain growth controlling layer, and a second magnetic pinned layer having a face centered cubic (FCC) texture or a hexagonal closed packing (HCP) texture.

In some embodiments, the second magnetic pinned layer includes a lower magnetic pinned region and an upper magnetic pinned region, wherein the lower magnetic pinned region and the upper magnetic pinned region are separated by a synthetic anti-ferromagnetic coupling layer. In such an embodiment, the lower magnetic pinned region and the upper magnetic pinned region both have a FCC texture or a HCP texture and thus strong PMA is provided.

In another aspect of the present application, a STT MRAM device is provided. In one embodiment, the STT MRAM device includes a top pinned MTJ stack located on a surface of a bottom electrode. In one embodiment, the top pinned MTJ stack includes a magnetic free layer having a BCC texture, a tunnel barrier layer having a BCC texture located on the magnetic free layer, and a magnetic pinned layered structure located on the tunnel barrier layer. In accordance with the present application, the magnetic pinned layered structure includes, from bottom to top, a first magnetic pinned layer having a BCC texture, a crystal grain growth controlling layer, and a second magnetic pinned layer having a FCC texture or a HCP texture.

In yet another embodiment of the present application, a method of forming a top pinned MTJ stack is provided. In one embodiment, the method includes forming a tunnel barrier layer having a body centered cubic (BCC) texture on a magnetic free layer having a BCC texture. Next, a first magnetic pinned layer having a BCC texture is formed on the tunnel barrier layer. A crystal grain growth controlling layer is then deposited on the first magnetic pinned layer, wherein the crystal grain growth controlling layer facilitates formation of a magnetic material having a face centered cubic (FCC) texture or a hexagonal closed packing (HCP) texture. A second magnetic pinned layer having the FCC texture or the HCP texture is then formed on the crystal grain growth controlling layer. In accordance with the present application, an in-situ anneal is performed after the depositing of the crystal grain growth controlling layer.

In some embodiments of the present application, the in-situ anneal is performed after the depositing of the crystal grain growth controlling layer, but prior to the forming of the second magnetic pinned layer. In other embodiments of the present application, the in-situ anneal is performed after the depositing of the crystal grain growth controlling layer and after the forming of a least a portion of the second magnetic pinned layer.

DETAILED DESCRIPTION

Figure 1:
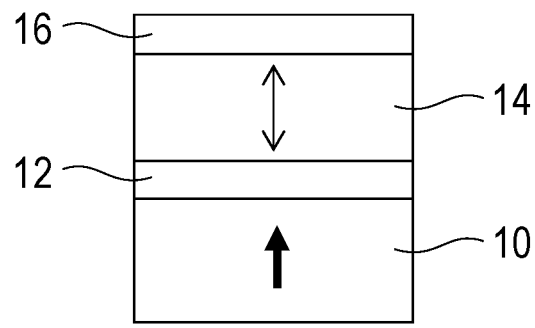
FIG. 1 is a cross sectional view of a prior art bottom pinned MTJ stack including, from bottom to top, a magnetic pinned (or reference) layer, a tunnel barrier layer, a magnetic free layer, and a MTJ capping layer.
Figure 2:
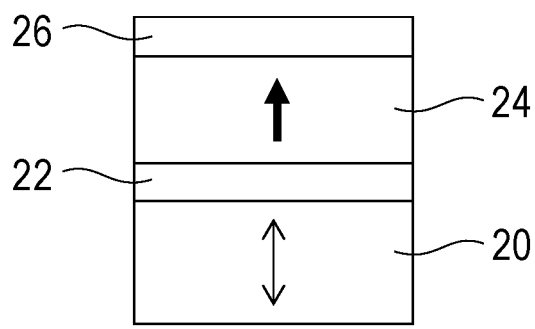
FIG. 2 is a cross sectional view of a prior art top pinned MTJ stack including, from bottom to top, a magnetic free layer, a tunnel barrier layer, a magnetic pinned (or reference) layer, and a MTJ capping layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides a top pinned magnetic tunnel junction (MTJ) stack containing a magnetic pinned layered structure including a second magnetic pinned layer having strong PMA (i.e., an in-field magnetic anisotropy field of greater than 4 kOe). In the present application, the magnetic pinned layered structure includes a crystal grain growth controlling layer located between a first magnetic pinned layer having a BCC texture and the second magnetic pinned layer. The presence of the crystal grain growth controlling layer facilitates formation of a second magnetic pinned layer having a FCC texture or a HCP texture which, in turn, promotes strong PMA, as defined above, to the second magnetic pinned layer of the magnetic pinned layered structure. The second magnetic pinned layer of the top pinned magnetic tunnel junction (MTJ) stack maintains the strong PMA even after performing a 400° C. or above BEOL annealing process which is used for embedded-type memory applications.

In the present application, the terms "face centered cubic texture or FCC texture" refer to a crystal structure having a unit cell that consists of an atom at each cube corner and an atom in the center of each cube face; it is a close-packed plane in which each face of the cube atoms are assumed to touch along face diagonals. The terms "body centered cubic texture or BCC texture" refer to a crystal structure having a unit cell in which a cube shape-lattice is formed with one atom in the middle and four other atoms arranged around it at the corners of the cube. The terms "hexagonal close packed texture or HCP texture" refer to a crystal structure having a unit cell consisting of three layers of atoms, the top and bottom layers contain six atoms at the corners of a hexagon and one atom at the center of each hexagon, the middle layer contains three atoms nestled between the atoms of the top and bottom layers.

Figure 3:
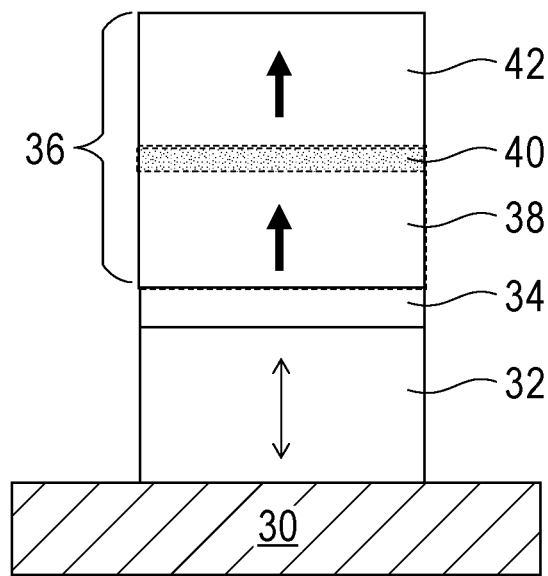
FIG. 3 is a cross sectional view of a top pinned MTJ stack in accordance with the present application and located on a surface of a bottom electrode.
Figure 4:
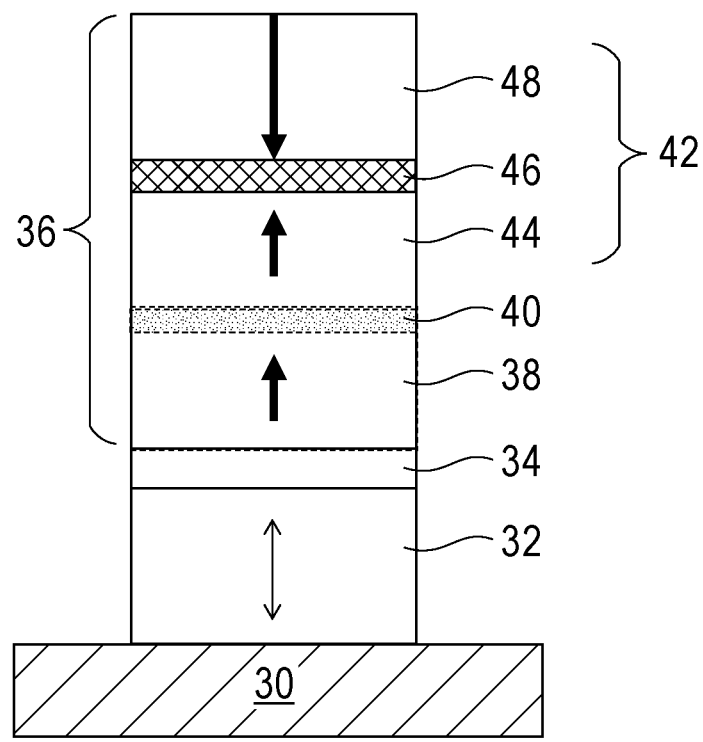
FIG. 4 is a cross sectional view of another top pinned MTJ stack in accordance with the present application and located on a surface of a bottom electrode.

Referring first to FIGS. 3-4, there are illustrated various top pinned MTJ stacks in accordance with the present application. As is shown in each of FIGS. 3 and 4, the top pinned MTJ stack is located on a bottom electrode 30. Notably, the top pinned MTJ stack illustrated in FIG. 3 includes a magnetic free layer 32 having a BCC texture, a tunnel barrier layer 34 having a BCC texture located on the magnetic free layer 32, and a magnetic pinned layered structure 36 located on the tunnel barrier layer 34. In accordance with the present application, the magnetic pinned layered structure 36 includes, from bottom to top, a first magnetic pinned layer 38 having a BCC texture, a crystal grain growth controlling layer 40, and a second magnetic pinned layer 42 having a FCC texture or a HCP texture.

The top pinned MTJ stack illustrated in FIG. 4 includes a magnetic free layer 32 having a BCC texture, a tunnel barrier layer 34 having a BCC texture located on the magnetic free layer 32, and a magnetic pinned layered structure 36 located on the tunnel barrier layer 34. In accordance with the present application, the magnetic pinned layered structure 36 includes, from bottom to top, a first magnetic pinned layer 38 having a BCC texture, a crystal grain growth controlling layer 40, and a second magnetic pinned layer 42 having a FCC texture or a HCP texture. In this embodiment, the second magnetic pinned layer 42 includes a lower magnetic pinned region 44 and an upper magnetic pinned region 48, wherein the lower magnetic pinned region 44 and the upper magnetic pinned region 48 are separated by a synthetic anti-ferromagnetic coupling layer 46.

In either embodiment, the double heading arrow in the magnetic free layer 32 denotes that the orientation in that layer can be switched, while the single headed arrow in the various magnetic layers or regions of the magnetic pinned layered structure 36 denotes that the orientation in those layers or regions are fixed. Also, and in either embodiment, the crystal grain growth controlling layer facilitates formation of a second magnetic pinned layer 42 having a FCC texture or a HCP texture which, in turn, promotes strong PMA to the second magnetic pinned layer 42 of the magnetic pinned layered structure 36.

The various elements/components of the structures shown in FIGS. 3-4 will now be described in greater detail. As mentioned above, the top pinned MTJ stacks shown in FIGS. 3 and 4 are located on a bottom electrode 30. Collectively, the bottom electrode 30 and the top pinned MTJ stack of the present application as shown, for example, in FIGS. 3-4, provide components/elements of a STT MRAM device. The bottom electrode 30 of the structures shown in FIGS. 3-4 is typically located on a surface of an electrically conductive structure (not shown). The electrically conductive structure is embedded in an interconnect dielectric material layer (also not shown). Another interconnect dielectric material layer (not shown) may embed the top pinned MTJ stacks illustrated in FIGS. 3-4. Another electrically conductive structure and a top electrode (both of which are not shown) can be located above the topmost surface of the top pinned MTJ stacks illustrated in FIGS. 3-4. The bottom electrode 30 may be composed of an electrically conductive material such as, for example, an electrically conductive metal, an electrically conductive metal alloy, or an electrically conductive metal nitride. Examples of electrically conductive metals that can be used to provide the bottom electrode 30 include, but are not limited to, copper (Cu), ruthenium (Ru), cobalt (Co), rhodium (Rh), tungsten (W), aluminum (Al), tantalum (Ta) or titanium (Ti). An example of electrically conductive metal alloy that can be used to provide the bottom electrode 30 includes, but is not limited to, Cu—Al, and an example of electrically conductive metal nitride that can be used to provide the bottom electrode 30 includes, but is not limited to, TaN or TiN. The bottom electrode 30 can be formed utilizing techniques well known to those skilled in the art. The conductive material that provides the bottom electrode 30 can be formed utilizing a deposition process such as, for example, chemical vapor deposition (CVD), plasma enhanced chemical vapor deposition (PECVD), sputtering or plating. The bottom electrode 30 can have a thickness from 10 nm to 200 nm; although other thicknesses are possible and can be used as the thickness of the bottom electrode 30. The bottom electrode 30 can be formed on a recessed surface or a non-recessed surface of the electrically conductive structure (not shown).

Although not shown in the drawings, a metallic seed layer is typically, but not necessarily always, positioned between the bottom electrode 30 and the magnetic free layer 32. When present, the metallic seed layer is formed on a physically exposed surface of the bottom electrode 30. The metallic seed layer that can be employed in the present application facilitates growth of magnetic free layer having a body centered cubic (BCC) texture. In one embodiment, the metallic seed layer can be composed of a bilayer of tantalum (Ta) and ruthenium (Ru). In another embodiment, the metallic seed layer can be composed of a bilayer of Ta and platinum (Pt). The metallic seed layer can have a total thickness from 1 nm to 50 nm. The metallic seed layer can be formed utilizing a deposition process including, for example, CVD, PECVD, physical vapor deposition (PVD), atomic layer deposition (ALD) or sputtering.

The magnetic free layer 32 having a BCC texture is then formed either on the metallic seed layer or on the bottom electrode 30. The magnetic free layer 32 is composed of at least one magnetic material with a magnetization that can be changed in orientation relative to the magnetization orientation of the magnetic pinned (i.e., reference) layer. Exemplary magnetic materials for the magnetic free layer 32 include alloys and/or multilayers of cobalt (Co), iron (Fe), alloys of cobalt-iron (Co—Fe), nickel (Ni), alloys of nickel-iron (Ni—Fe), and alloys of cobalt-iron-boron (Co—Fe—B). Typically, the magnetic free layer 32 is composed of multilayers of Co or multilayers of Co alloy containing at least 50 atomic percent Co. The magnetic free layer 32 that can be employed in the present application can have a thickness from 1 nm to 3 nm; although other thicknesses for the magnetic free layer 32 can be used. The magnetic free layer 32 can be formed utilizing a deposition process including, for example, CVD, PECVD, PVD, ALD or sputtering.

The tunnel barrier layer 34 having a BCC texture is composed of an insulator material and is formed at such a thickness as to provide an appropriate tunneling resistance. Exemplary materials for the tunnel barrier layer 34 include magnesium oxide, aluminum oxide, and titanium oxide, or materials of higher electrical tunnel conductance, such as semiconductors or low-bandgap insulators. In one embodiment, magnesium oxide is used as the material that provides the tunnel barrier layer 34. The thickness of tunnel barrier layer 34 can be from 0.5 nm to 1.5 nm; although other thicknesses for the tunnel barrier layer 34 can be used as long as the selected thickness provides a desired tunnel barrier resistance. The tunnel barrier layer 34 can be formed utilizing a deposition process including, for example, CVD, PECVD, PVD, ALD or sputtering.

The magnetic pinned layered structure 36 is then formed on the tunnel barrier layer 34. In the embodiment illustrated in FIG. 3, the magnetic pinned layered structure 36 includes, from bottom to top, a first magnetic pinned layer 38 having a BCC texture, a crystal grain growth controlling layer 40, and a second magnetic pinned layer 42 having a FCC texture or a HCP texture. In the embodiment shown in FIG. 4, the magnetic pinned layered structure 36 includes, from bottom to top, a first magnetic pinned layer 38 having a BCC texture, a crystal grain growth controlling layer 40, a lower magnetic pinned region 44 and an upper magnetic pinned region 48, wherein the lower magnetic pinned region 44 and the upper magnetic pinned region 48 are separated by a synthetic anti-ferromagnetic coupling layer 46. In the embodiment illustrated FIG. 4, the lower magnetic pinned region 44, the synthetic anti-ferromagnetic coupling layer 46, and the upper magnetic pinned region 48 constituent a second magnetic pinned layer 42 having a FCC texture or a HCP texture. In either embodiment, the magnetic pinned layered structure 36 can be formed utilizing a deposition process including, for example, CVD, PECVD, PVD, ALD or sputtering.

The first magnetic pinned layer 38 having the BCC texture that is employed in the present application has a fixed magnetization. The magnetic material employed in providing the first magnetic pinned layer 38 can be selected for optimizing the barrier at the tunnel barrier layer 36 interface. Examples of such optimization might include high tunnel magnetoresistance (TMR), high interface anisotropy or good interface wetting. Thus, and in some embodiments, the first magnetic pinned layer 38 can be composed of a metal or metal alloy that includes one or more metals exhibiting high spin polarization. In alternative embodiments, exemplary metals for the formation of the first magnetic pinned layer 38 include iron, nickel, cobalt, chromium, boron, and manganese. Exemplary metal alloys may include the metals exemplified above (i.e., iron, nickel, cobalt, chromium, boron, and manganese). In some embodiments, the first magnetic pinned layer 38 is composed of a cobalt-iron-boron (Co—Fe—B) alloy or a Co—Fe—B alloy multilayered stack containing additional iron. A metal insertion layer can present in the Co—Fe—B alloy multilayered stack, wherein the metal insertion layer comprises tungsten (W), tantalum (Ta), iridium (Ir) or terbium (Tb). The first magnetic pinned layer 38 can be formed utilizing a deposition process including, for example, CVD, PECVD, PVD, ALD or sputtering. The first magnetic pinned layer 38 can have a thickness from 3 nm to 20 nm; although other thicknesses for the first magnetic pinned layer 38 can be used.

The crystal grain growth controlling layer 40 is then formed on the first magnetic pinned layer 38. The crystal grain growth controlling layer 40 is composed of a metal that facilitates formation of a magnetic material having a FCC texture or a HCP texture. Illustrative examples of metals that facilitate formation of a magnetic material having a FCC texture or a HCP texture include rhodium (Rh), gadolinium (Gd), holmium (Ho), tantalum (Ta), hafnium (Hf) or tungsten (W). The crystal grain growth controlling layer 40 can have a thickness from 0.05 nm to 2 nm. In some examples, the crystal grain growth controlling layer 40 includes Rh having a thickness of 0.5 nm, Rh having a thickness of 1 nm, or Rh having a thickness of 1.5 nm.

The crystal grain growth controlling layer 40 can be formed utilizing a deposition process including, for example, CVD, PECVD, PVD, ALD or sputtering. An in-situ anneal is performed after the deposition of the crystal grain growth controlling layer 40. The in-situ anneal is critical for providing the FCC or HCP texture to the subsequently formed second magnetic pinned layer 42. Without the in-situ anneal, the second magnetic pinned layer has a BCC texture and thus strong PMA is not obtained.

In some embodiments, the in-situ anneal is performed after the depositing of the crystal grain growth controlling layer 40, but prior to the forming of the second magnetic pinned layer 42. In other embodiments, the in-situ anneal is performed after the depositing of the crystal grain growth controlling layer 40 and after the forming of a least a portion of the second magnetic pinned layer 42. In this embodiment, the in-situ anneal can be formed when only a portion of, or the entirety of, the second magnetic pinned layer 42 is formed.

In either embodiment, the in-situ anneal is performed in an inert ambient (i.e., atmosphere) and at temperature from 300° C. to 400° C., for a time period from 1 hour to 3 hours. Exemplary inert ambients include, but are not limited to, helium, argon or a helium-argon mixture.

In the embodiment illustrated in FIG. 3, the second magnetic pinned layer 42 has a fixed magnetization. In one embodiment, the second magnetic pinned layer 42 of the top pinned MTJ stack shown in FIG. 3 can be composed of a metal or metal alloy that includes one or more metals exhibiting high spin polarization. In alternative embodiments, exemplary metals for the formation of the second magnetic pinned layer 42 of the top pinned MTJ stack shown in FIG. 3 include iron, nickel, cobalt, chromium, boron, and manganese. Exemplary metal alloys may include the metals exemplified above (i.e., iron, nickel, cobalt, chromium, boron, and manganese). In some embodiments, the second magnetic pinned layer 42 of the top pinned MTJ stack shown in FIG. 3 is composed of a multilayer or superlattice of cobalt (Co) and platinum (Pt), a multilayer or superlattice of cobalt (Co) and palladium (Pd) or a multilayer or superlattice of cobalt (Co), nickel (Ni) and platinum (Pt). The second magnetic pinned layer 42 of the top pinned MTJ stack shown in FIG. 3 can be formed utilizing a deposition process including, for example, CVD, PECVD, PVD, ALD or sputtering. The second magnetic pinned layer 42 of the top pinned MTJ stack shown in FIG. 3 can have a thickness from 3 nm to 20 nm; although other thicknesses for the second magnetic pinned layer 42 can be used.

In some embodiments and as is shown in FIG. 4, the second magnetic pinned layer 42 can be a multilayer arrangement having (1) a high spin polarization region formed from of a metal and/or metal alloy using the metals mentioned above (i.e., iron, nickel, cobalt, chromium, boron, and manganese), and (2) a region constructed of a material or materials that exhibit strong perpendicular magnetic anisotropy (strong PMA). Exemplary materials with strong PMA that may be used include a metal such as cobalt (Co), nickel (Ni), platinum (Pt), palladium (Pd), iridium (Ir), or ruthenium (Ru), and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed. In the embodiment illustrated in FIG. 4, the second magnetic pinned layer 42 includes a lower magnetic pinned region 44 and an upper magnetic pinned region 48, wherein the lower magnetic pinned region 44 and the upper magnetic pinned region 48 are separated by a synthetic anti-ferromagnetic coupling layer 46. In such an embodiment, the lower magnetic pinned region 44 and the upper magnetic pinned region 48 can be composed of a multilayer or superlattice of cobalt (Co) and platinum (Pt), a multilayer or superlattice of cobalt (Co) and palladium (Pd) or a multilayer or superlattice of cobalt (Co), nickel (Ni) and platinum (Pt), and the synthetic anti-ferromagnetic coupling layer 46 is composed of a metal such as cobalt (Co), nickel (Ni), platinum (Pt), palladium (Pd), iridium (Ir), or ruthenium (Ru). The second magnetic pinned layer 42 of the top pinned MTJ stack shown in FIG. 4 can be formed utilizing one or more deposition processes including, for example, CVD, PECVD, PVD, ALD or sputtering. The second magnetic pinned layer 42 of the top pinned MTJ stack shown in FIG. 4 can have a thickness from 3 nm to 20 nm; although other thicknesses for the second magnetic pinned layer 42 can be used. The synthetic anti-ferromagnetic coupling layer 46 within the second magnetic pinned layer 42 can have a thickness from 0.2 nm to 0.8 nm.

A MTJ capping layer (not shown) is typically formed on the second magnetic pinned layer 42 shown in either FIG. 3 of FIG. 4. The MTJ capping layer is preferentially composed of magnesium oxide (MgO). Other materials for the MTJ capping layer include aluminum oxide ($Al_2O_3$), calcium oxide (CaO), tantalum oxide ($Ta_2O_5$), niobium oxide ($Nb_2O_5$) or ternary oxides such as, for example, $Mg_yTi_{(1-y)}O_x$. The MTJ capping layer can have a thickness from 0.3 nm to 2 nm; other thicknesses are possible and can be used in the present application as the thickness of the MTJ capping layer. The MTJ capping layer can be formed utilizing one or more deposition processes including, for example, CVD, PECVD, PVD, ALD or sputtering.

A hard mask (not shown) is typically formed above the MTJ capping layer. The hard mask can be composed of a metal nitride such as, for example, tantalum nitride (TaN) or titanium nitride (TiN) or a metal such as, for example, titanium (Ti) or tantalum (Ta). In some embodiments, the hard mask can be employed as a top electrode of the STT MRAM device. In other embodiments, a separate top electrode (composed of one of the electrically conductive materials mentioned above for the bottom electrode 30) can be formed on the hard mask. The hard mask can have a thickness from 50 nm to 1500 nm; although other thicknesses for the hard mask can be used in the present application.

The top pinned MTJ stack of the present application (and the MTJ capping layer and the hard mask) can be formed by deposition of the various material layers that provide the specific top pinned MTJ stack of the present application (and the MTJ capping layer and the hard mask), followed by a patterning process such as, for example, lithography and etching. The top pinned MTJ stack of the present application (and the MTJ capping layer and the hard mask) can have a critical dimension (CD) that is less than or equal to, the critical dimension (CD) of the bottom electrode 30. The deposition of the various material layers that provide the top pinned MTJ stack of the present application (and the MTJ capping layer and the hard mask) can be performed in a same deposition tool or different deposition tools.

The top pinned MTJ stacks of the present application are stable with high-temperature annealing cycles (400° C. back-end-of-the-line (BEOL) processes required for embedded-type memory applications). The reason is related to controlled texturization of the second magnetic pinned layer 42 which is obtained utilizing the crystal grain growth controlling layer 40 and the in-situ anneal as described herein above.

Figure 5A:
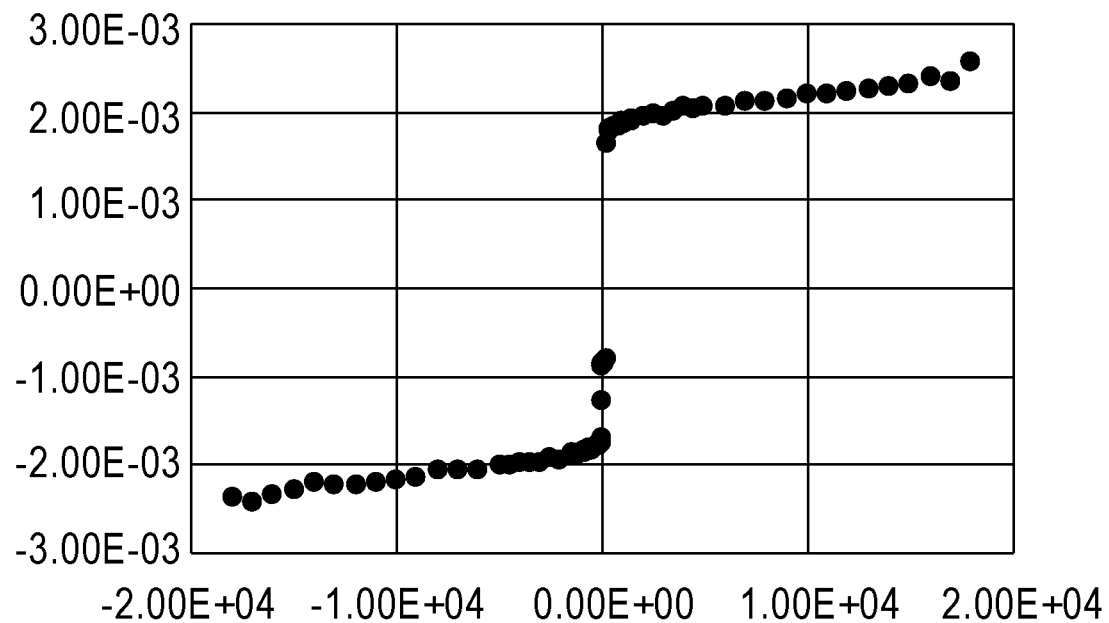
FIGS. 5A-5C are graphs showing the out-of plane hysteresis loop of top pinned MTJ stacks in accordance with the present application and after a 400° C. BEOL.
Figure 5B:
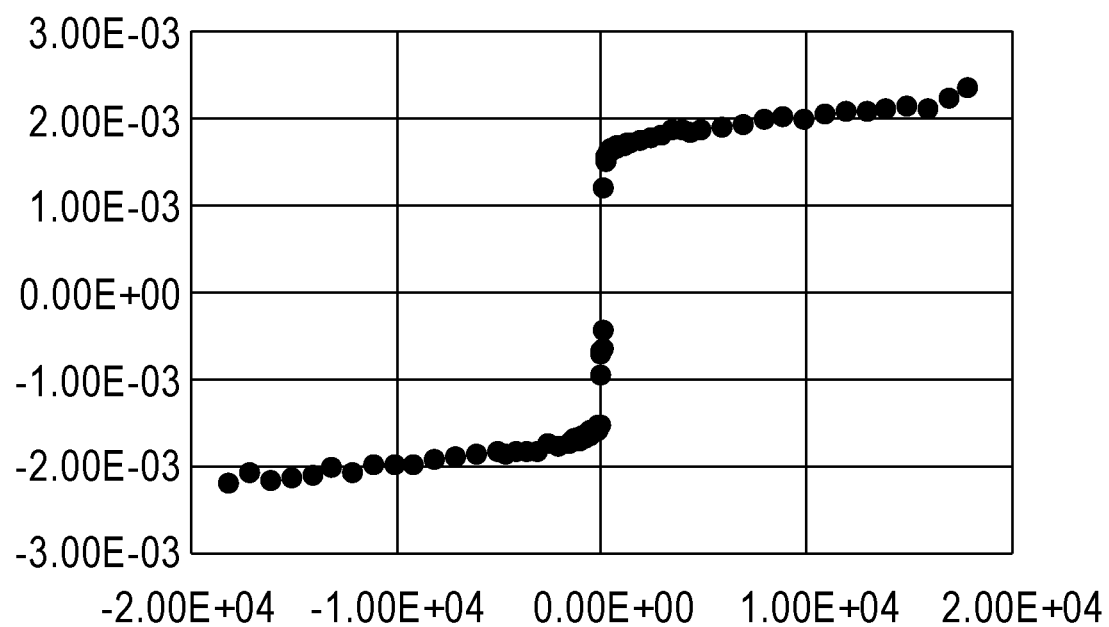
Figure 5C:
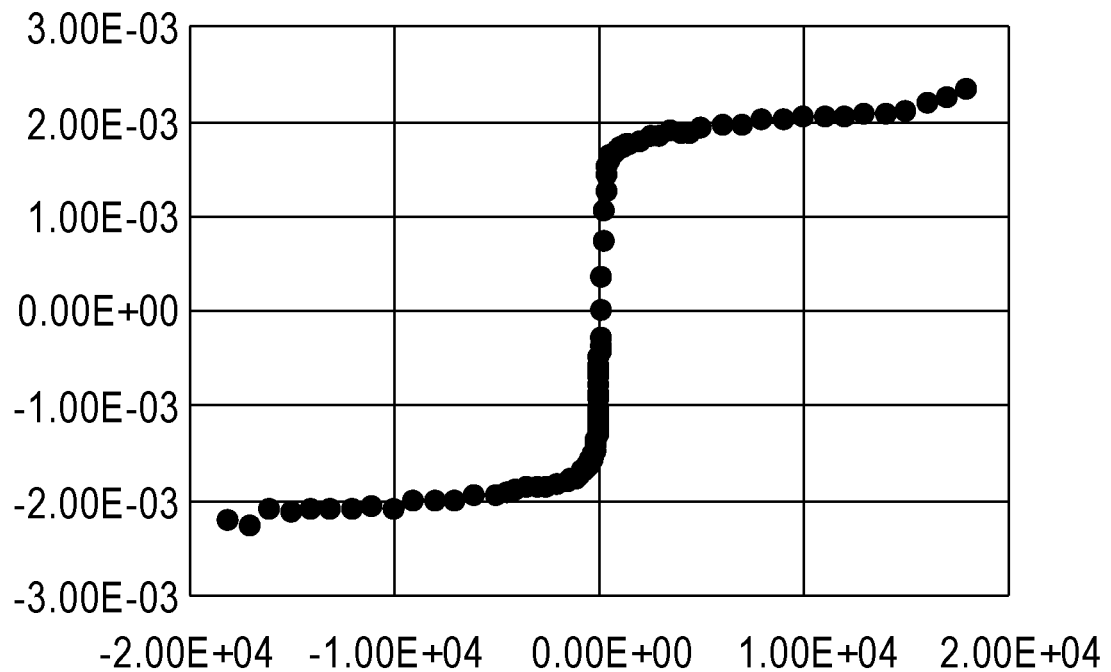
Figure 6A:
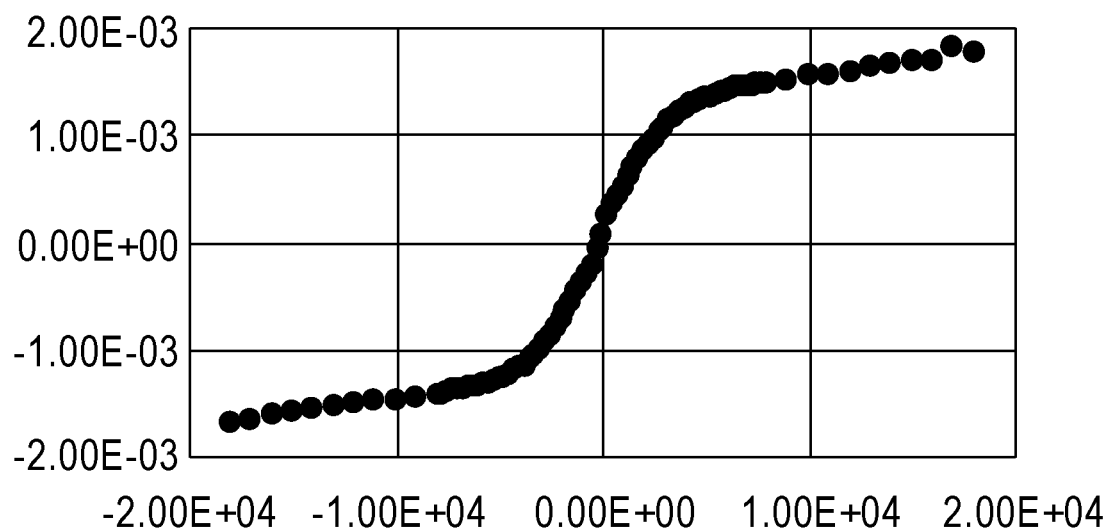
FIGS. 6A-6C are graphs showing the in-plane hysteresis loop of top pinned MTJ stacks in accordance with the present application and after a 400° C. BEOL
Figure 6B:
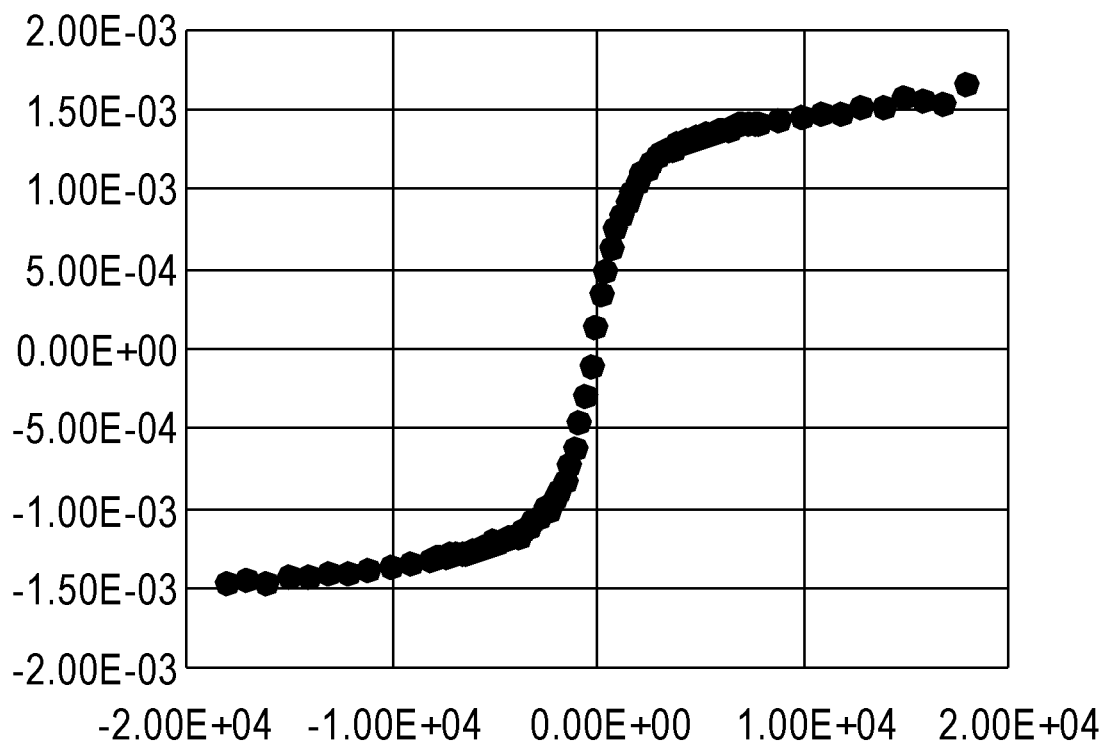
Figure 6C:
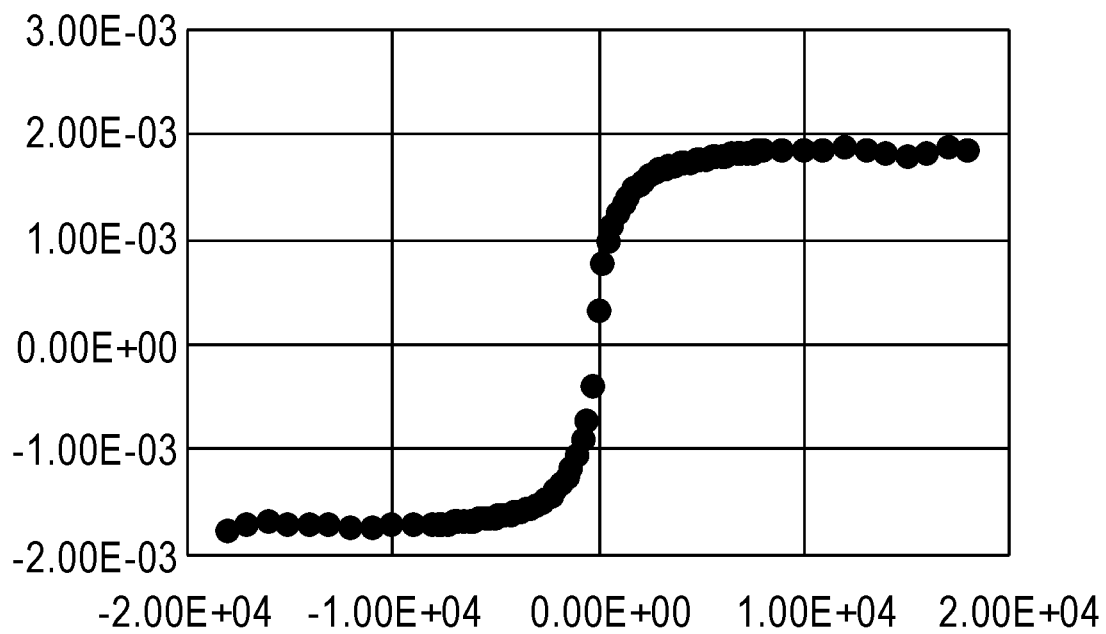

This is illustrated by viewing the data shown in FIGS. 5A, 5B, 5C, 6A, 6B and 6C. Notably, FIGS. 5A-5C are graphs showing the out-of plane hysteresis loop of top pinned MTJ stacks in accordance with the present application and after a 400° C. BEOL, while FIGS. 6A-6C are graphs showing the in-of plane hysteresis loop of top pinned MTJ stacks in accordance with the present application and after a 400° C. BEOL. The top pinned MTJ stacks used in generating the graphs shown in FIGS. 5A, 5B, 5C, 6A, 6B and 6C were identical expect for the thickness of the rhodium (Rh) crystal grain growth controlling layer. In the top pinned MTJ stacks used in generating the data shown in FIGS. 5A, 5B, 5C, 6A, 6B and 6C, BCC texture was located below the crystal grain growth controlling layer, while FCC texture was located above the crystal grain growth controlling layer. Each top pinned MTJ stack included a Ta metallic seed, a Co—Fe—B magnetic free layer, a magnesium oxide tunnel barrier layer, a Co—Fe—B first magnetic pinned layer, a Rh crystal grain growth controlling layer (with different thicknesses), and a multilayer of Co and Pt second magnetic free layer. For the data shown in FIGS. 5A and 6A, the Rh crystal grain growth controlling layer had a thickness of 0.5 nm, for the data shown in FIGS. 5B and 6B, the Rh crystal grain growth controlling layer had a thickness of 1 nm, and for the data shown in FIGS. 5C and 6C, the Rh crystal grain growth controlling layer had a thickness of 1.5 nm. Both out-of plane and in-plane hysteresis loops were generated by vibrating sample magnetometry (VSM).

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A top pinned magnetic tunnel junction (MTJ) stack comprising:
   a magnetic free layer having a body centered cubic (BCC) texture;
   a tunnel barrier layer having a BCC texture and located on the magnetic free layer; and
   a magnetic pinned layered structure located on the tunnel barrier layer, wherein the magnetic pinned layered structure comprises, from bottom to top, a first magnetic pinned layer having a BCC texture, a crystal grain growth controlling layer, and a second magnetic pinned layer having a face centered cubic (FCC) texture or a hexagonal closed packing (HCP) texture, wherein the crystal grain growth controlling layer is composed of a metal that facilitates formation of a magnetic material having the FCC texture or the HCP texture and the metal comprises rhodium (Rh), gadolinium (Gd), holmium (Ho), tantalum (Ta), hafnium (Hf) or tungsten (W).

2. A top pinned magnetic tunnel junction (MTJ) stack comprising:
   a magnetic free layer having a body centered cubic (BCC) texture;
   a tunnel barrier layer having a BCC texture and located on the magnetic free layer; and
   a magnetic pinned layered structure located on the tunnel barrier layer, wherein the magnetic pinned layered structure comprises, from bottom to top, a first magnetic pinned layer having a BCC texture, a crystal grain growth controlling layer, and a second magnetic pinned layer having a face centered cubic (FCC) texture or a hexagonal closed packing (HCP) texture, wherein the second magnetic pinned layer comprises a lower magnetic pinned region and an upper magnetic pinned region, wherein the lower magnetic pinned region and the upper magnetic pinned region are separated by a synthetic anti-ferromagnetic coupling layer.

3. The top pinned MTJ stack of claim 2, wherein the crystal grain growth controlling layer is composed of a metal that facilitates formation of a magnetic material having the FCC texture or the HCP texture.

4. The top pinned MTJ stack of claim 3, wherein the metal that facilitates formation of a magnetic material having the FCC texture or the HCP texture comprises rhodium (Rh), gadolinium (Gd), holmium (Ho), tantalum (Ta), hafnium (Hf) or tungsten (W).

5. The top pinned MTJ stack of claim 1, wherein the crystal grain growth controlling layer has a thickness from 0.05 nm to 2 nm.

6. The top pinned MTJ stack of claim 1, wherein the first magnetic pinned layer is composed of a cobalt-iron-boron (Co—Fe—B) alloy or a Co—Fe—B alloy multilayered stack containing additional iron.

7. The top pinned MTJ stack of claim 6, further comprising a metal insertion layer present in the Co—Fe—B alloy multilayered stack, wherein the metal insertion layer comprises tungsten (W), tantalum (Ta), iridium (Ir) or terbium (Tb).

8. The top pinned MTJ stack of claim 1, wherein the second magnetic pinned layer is composed of a multilayer or superlattice of cobalt (Co) and platinum (Pt), a multilayer or superlattice of cobalt (Co) and palladium (Pd) or a multilayer or superlattice of cobalt (Co), nickel (Ni) and platinum (Pt).

9. A spin-transfer torque magnetoresistive random access memory (STT MRAM) device comprising:
   a top pinned magnetic tunnel junction (MTJ) stack located on a bottom electrode, wherein the top pinned MTJ stack comprises:
   a magnetic free layer having a body centered cubic (BCC) texture;

a tunnel barrier layer having a BCC texture and located on the magnetic free layer; and a magnetic pinned layered structure located on the tunnel barrier layer, wherein the magnetic pinned layered structure comprises, from bottom to top, a first magnetic pinned layer having a BCC texture, a crystal grain growth controlling layer, and a second magnetic pinned layer having a face centered cubic (FCC) texture or a hexagonal closed packing (HCP) texture, wherein the crystal grain growth controlling layer is composed of a metal that facilitates formation of a magnetic material having the FCC texture or the HCP texture, and the metal comprises rhodium (Rh), gadolinium (Gd), holmium (Ho), tantalum (Ta), hafnium (Hf) or tungsten (W).

10. The STT MRAM device of claim 9, wherein the second magnetic pinned layer comprises a lower magnetic pinned region and an upper magnetic pinned region, wherein the lower magnetic pinned region and the upper magnetic pinned region are separated by a synthetic anti-ferromagnetic coupling layer.

11. The STT MRAM device of claim 9, wherein the crystal grain growth controlling layer has a thickness from 0.05 nm to 2 nm.

12. The STT MRAM device of claim 9, wherein the first magnetic pinned layer is composed of a cobalt-iron-boron (Co—Fe—B) alloy or a Co—Fe—B alloy multilayered stack containing additional iron.

13. The STT MRAM device of claim 12, further comprising a metal insertion layer present in the Co—Fe—B alloy multilayered stack, wherein the metal insertion layer comprises tungsten (W), tantalum (Ta), iridium (Ir) or terbium (Tb).

14. The STT MRAM device of claim 9, wherein the second magnetic pinned layer is composed of a multilayer or superlattice of cobalt (Co) and platinum (Pt), a multilayer or superlattice of cobalt (Co) and palladium (Pd) or a multilayer or superlattice of cobalt (Co), nickel (Ni) and platinum (Pt).

* * * * *